United States Patent
Fry et al.

(10) Patent No.: US 9,847,787 B1
(45) Date of Patent: Dec. 19, 2017

(54) INDEPENDENT DIGITAL-TO-ANALOG CONVERTER SYNCHRONIZATION

(71) Applicant: TEKTRONIX, INC., Beaverton, OR (US)

(72) Inventors: Brandon Z. Fry, Aloha, OR (US); Brett Trevor, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/339,448

(22) Filed: Oct. 31, 2016

(51) Int. Cl.
*H03M 1/10* (2006.01)
*H03M 1/66* (2006.01)

(52) U.S. Cl.
CPC ........... *H03M 1/1009* (2013.01); *H03M 1/66* (2013.01)

(58) Field of Classification Search
CPC ............ H03M 1/009; H03M 1/66; H03L 1/78
USPC .......... 341/155, 118, 120, 111, 153; 327/157
See application file for complete search history.

(56) References Cited

U.S. PATENT DOCUMENTS

| | | | |
|---|---|---|---|
| 6,549,157 B1* | 4/2003 | Tseng | H03M 1/0836 341/144 |
| 9,564,913 B1* | 2/2017 | Courcy | H04L 7/033 |

* cited by examiner

*Primary Examiner* — Peguy Jean Pierre
(74) *Attorney, Agent, or Firm* — Marger Johnson; Kevin Dothager

(57) ABSTRACT

A device includes at least two digital-to-analog converters, each digital-to-analog converter having a digital-to-analog converter clock modulator, a system reference clock modulator, and a phase detector to track the phases of the clock and the system reference clock. A method of calibrating a phase detector includes providing a pulse waveform, aligning a phase of a digital-to-analog clock to a phase of an internal system reference clock, aligning a phase of a modulated system reference clock with a phase of a modulated, divided, digital-to-analog clock, storing the aligned phase of the modulated system reference clock as a calibration value, synchronizing the digital-to-analog converters and adjusting the phase of the digital-to-analog converters to a center of a desired phase, and storing the aligned phase of the digital-to-analog converters as a calibration value.

9 Claims, 5 Drawing Sheets

INDEPENDENT DIGITAL-TO-ANALOG CONVERTER SYNCHRONIZATION

TECHNICAL FIELD

This disclosure relates to digital-to-analog converters, more particularly to synchronizing multiple digital-to-analog converters in a device.

BACKGROUND

Digital-to-analog (DAC) converters have many applications, among them testing equipment and wave generators, which are sometimes also used in testing equipment. All the DACs in the device are synchronized using common phase detector hardware that measures the relationships between all the DAC outputs. The clocks are shifted until they are all aligned and the outputs of the DACs become de-skewed.

Issues arise in this method of synchronization because each DAC module need to have connections to the common phase detector circuit. This results in extra routing traces and less flexibility and re-use. If a system designer wanted extra channels, the phase detector would have to change to accommodate the extra DACs for the extra channels.

SUMMARY

One embodiment is a device including at least two digital-to-analog converters, each digital-to-analog converter having a digital-to-analog converter clock modulator, a system reference clock modulator, and a phase detector to track the phases of the clock and the system reference clock.

Another embodiment is a method of calibrating a phase detector including providing a pulse waveform, aligning a phase of a digital-to-analog clock to a phase of an internal system reference clock, aligning a phase of a modulated system reference clock with a phase of a modulated, divided, digital-to-analog clock, storing the aligned phase of the modulated system reference clock as a calibration value, synchronizing the digital-to-analog converters and adjusting the phase of the digital-to-analog converters to a center of a desired phase, and storing the aligned phase of the digital-to-analog converters as a calibration value.

DETAILED DESCRIPTION OF THE EMBODIMENTS

Figure 1:
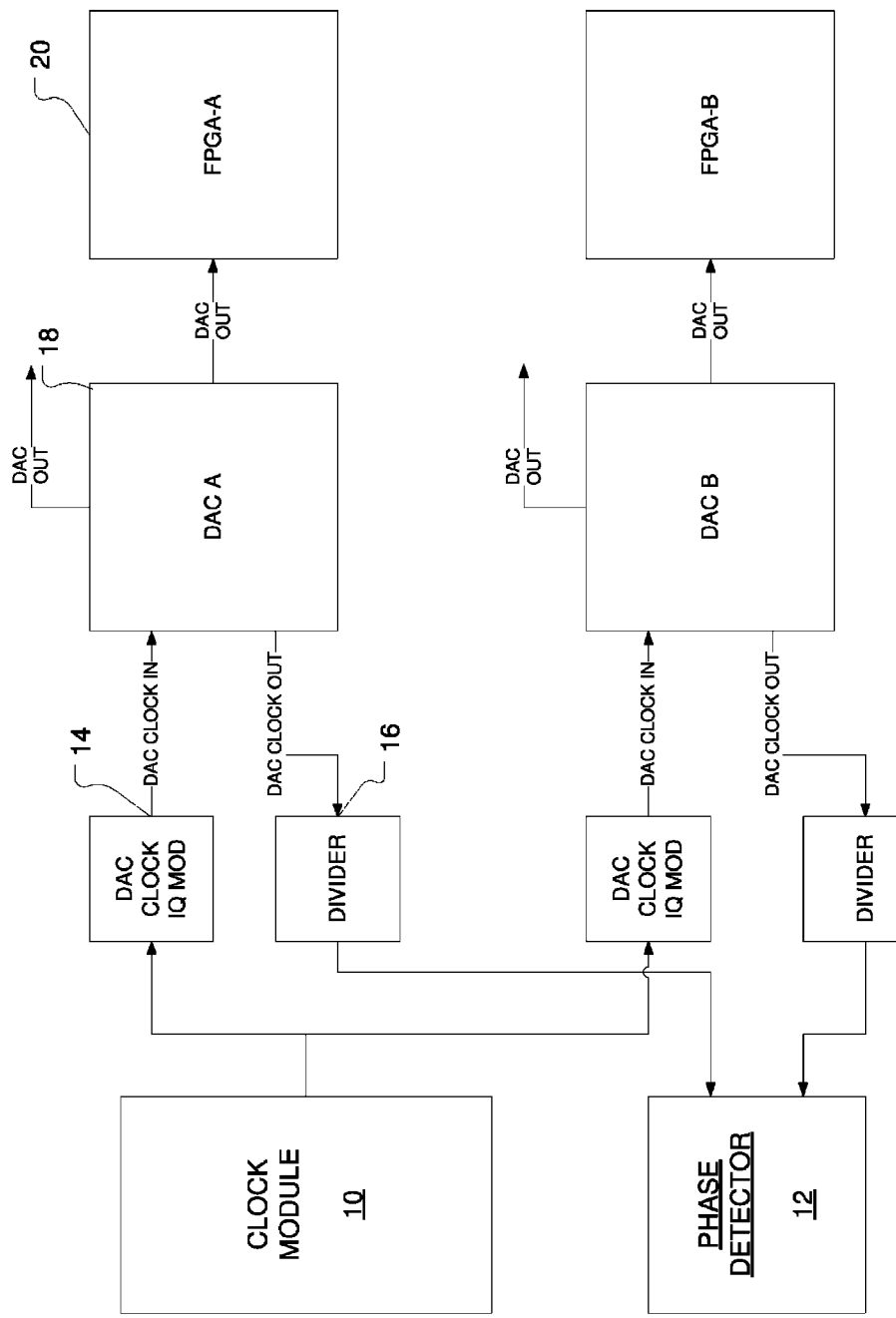
FIG. 1 shows a prior art implementation of a dual channel system having a common phase detector

FIG. 1 shows a prior art example of a typical set of digital-to-analog converters (DACs) and a centralized phase detector. The example shown has two DACs, DAC A 18, and DAC B. This discussion will only focus on DAC A 18, with the understanding that the same discussion applies to DAC B. Each DAC has a connection to a clock module 10 that generates a system clock. The clock is provided to an IQ modulator for each DAC to produce a DAC clock.

The IQ modulator modulates the in-phase (I) and quadrature (Q) phases of the DAC clock to rotate them according to a desired phase. The term 'rotate' is used because the IQ signals are typically plotted on a polar axis, but may also be thought of delaying or shifting the phase of the signals. In the system of FIG. 1, the phase detector 12 receives each of the DAC clock signals from the DACs such as 18 divided by 16. The phase detector then measures the relationships between all the DAC clocks. The voltage of the phase detector is compared to a known calibration value. When the measured voltage equals the calibration value, the DAC clocks are aligned and the outputs are de-skewed.

The voltage calibration value is used as a starting point. The process 'rotates,' or shifts, the clock so that it reaches the desired phase detector voltage, then it does a fine adjustment on the clock to the desired phase. The phase detector voltage would not match the calibration voltage value. One should note that the DAC here is attached to an FPGA 20 (field-programmable gate array) that generates the original digital signal that undergoes conversion.

This synchronization method relies upon the calibration of the phase detector. To calibrate the phase detector, a test waveform is generated and test equipment, such as an oscilloscope measure the outputs of each DAC. The outputs are de-skewed. Delays sometimes exist in the output signals, meaning that some signals are delayed compared to other signals. De-skewing typically compensates for that delay by slowing down the faster signals such that all signals synchronize. This may also be referred to as aligning the signals. Once all the signals are aligned, the phase detector voltages are measured and stored in memory. These become the calibration values mentioned above.

The issue with a single phase detector for the DAC clocks lies in the lack of flexibility as well as the extra routing paths. If one were to add another channel, requiring another DAC, the phase detector circuit must be re-designed to accommodate the new channel. Further, the connection between each DAC clock back to the phase detector requires extra routing, complicating the layout of the circuit.

Figure 2:
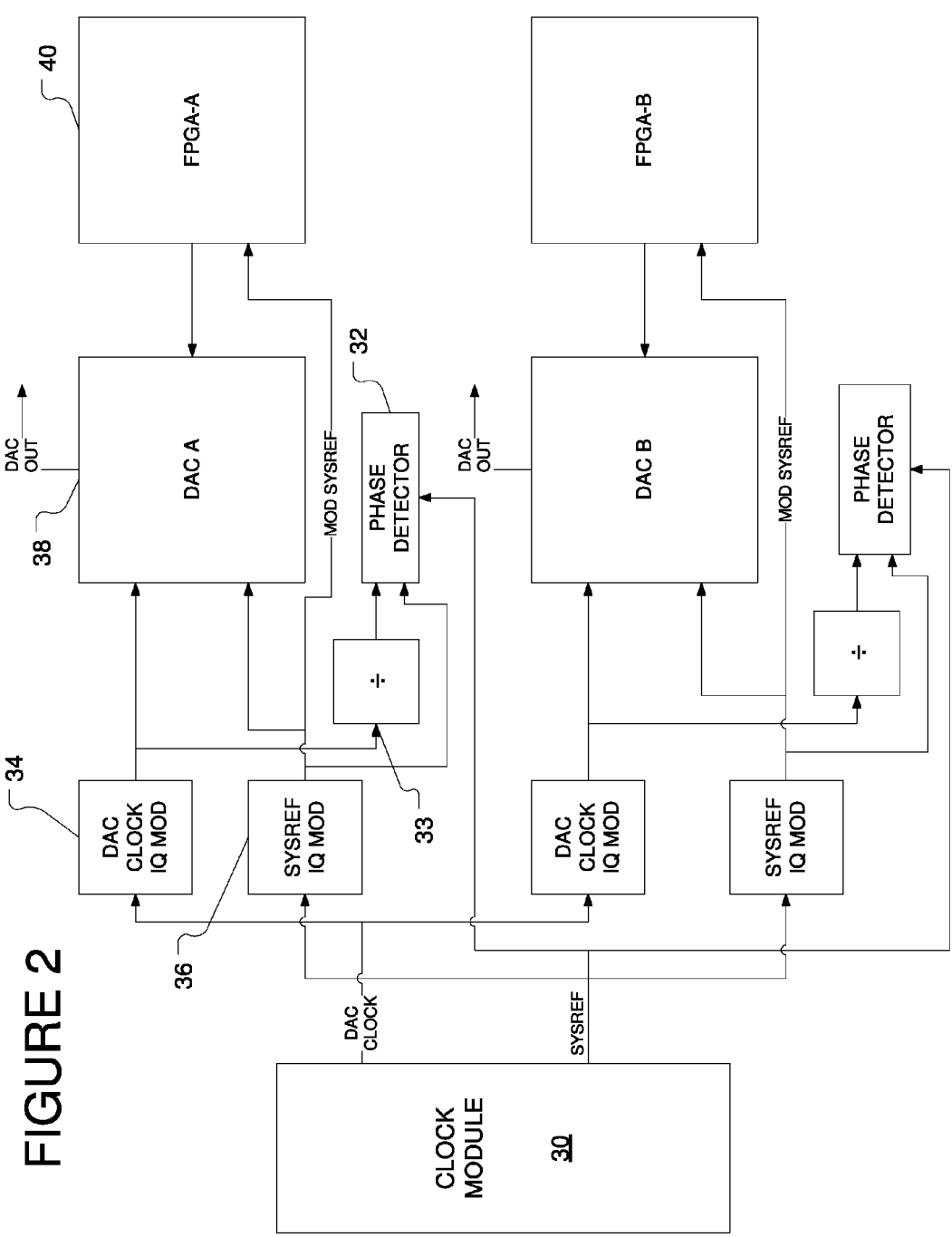
FIG. 2 shows an embodiment of a system having independent digital-to-analog converter synchronization.

In contrast to the prior art of FIG. 1, FIG. 2 shows an embodiment of a set of DACs having independent synchronization, making the layout more flexible and having simpler routing paths. The common phase detector circuitry of FIG. 1 has been removed and instead uses independent, smaller phase detectors such as 32. Unlike FIG. 1, where the number of channels, and therefore DACs, is fixed for a particular phase detector, this arrangement allows multiple DACs to be added without requiring a re-design.

To ensure synchronization, it is important that all the devices operate off the same clock source. The clock module 30 generates two clocks, a common DAC clock and an internal system reference clock, or SYSREF. The SYSREF clock is generated by dividing the DAC clock inside of the clock module. There are internal dividers in the clock module that divide the DAC clock and generate what will be referred to here as the internal SYSREF. The dividers 33 connected to the DAC CLOCK IQ MOD are used to divide the modulated DAC clock down so that it can be accurately compared to SYSREF. The DAC clock IQ modulators such as 34 and the SYSREF IQ modulator 36 rotate the DAC clocks and SYSREF clocks, referred to here as the modulated SYSREF clock, going to the DACs and the FPGA to ensure that they are aligned. The phase detectors such as 32 monitor the relationship between the two clocks to ensure that the setup and hold windows remain valid The setup time is the minimum time before a clock's leading edge in which the data must be valid. Similarly, the hold time is the minimum time after the leading edge for which the data must be valid. For the data outputs to be valid, the set up and hold time windows required for the application or standard under which the system operates must be met.

Figure 3:
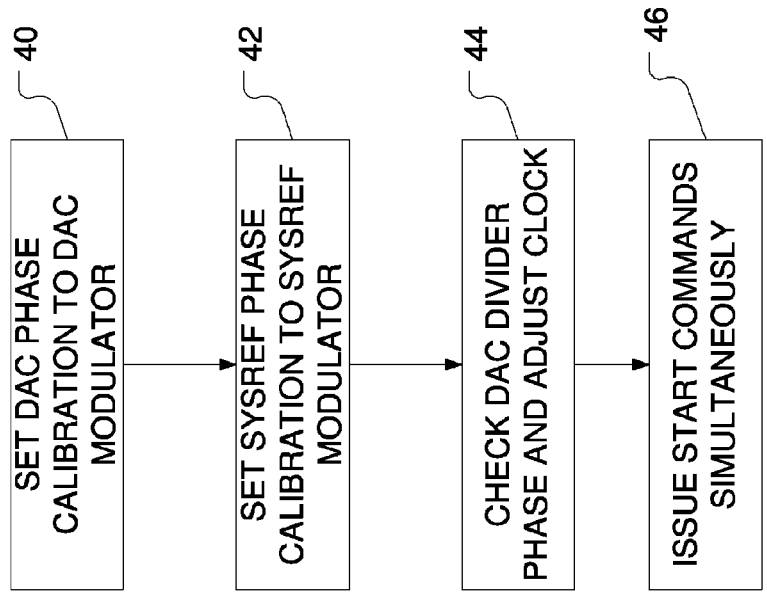
FIG. 3 shows a flowchart of one embodiment of a method to synchronize digital-to-analog converters.
Figure 4:
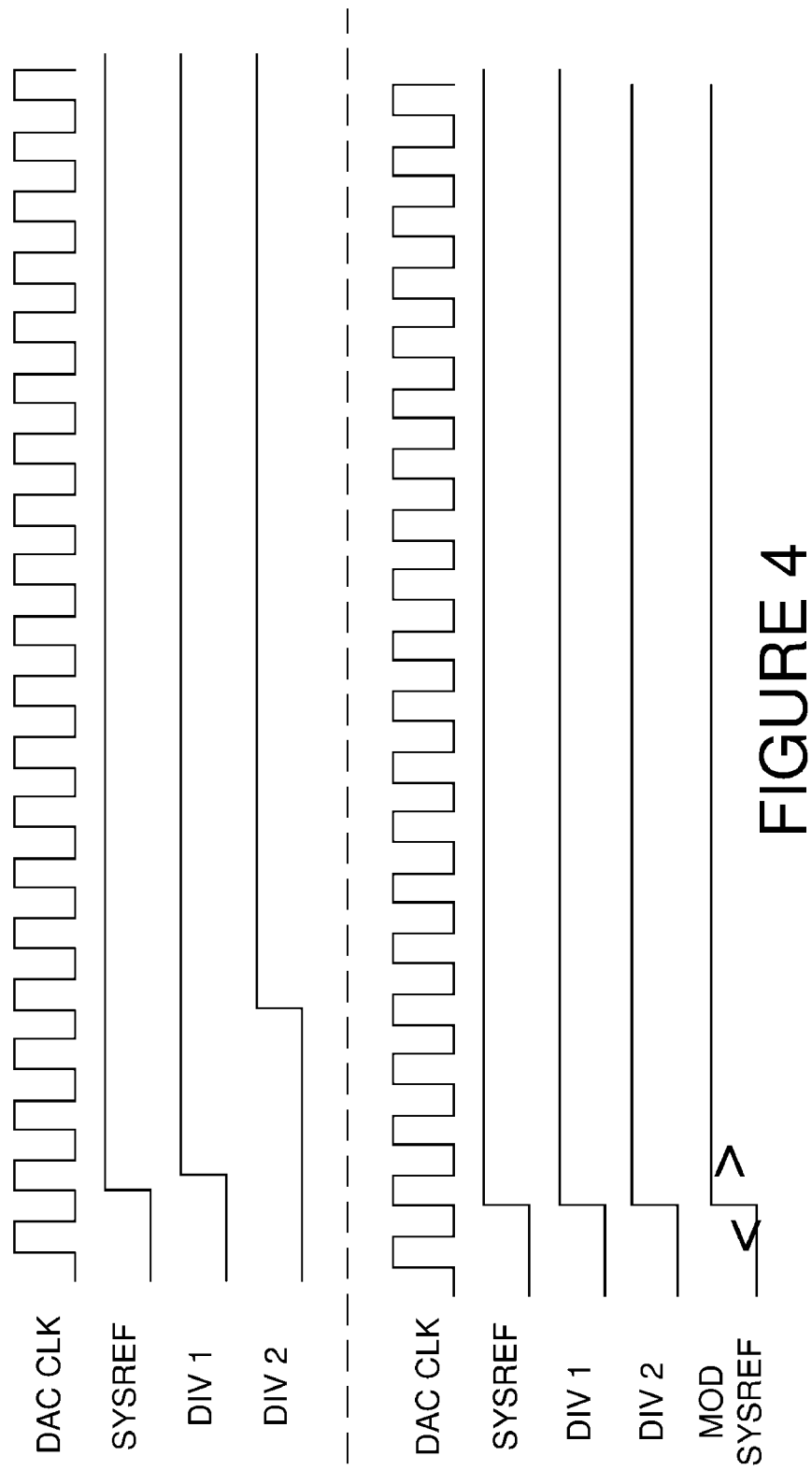
FIG. 4 shows a timing diagram of a pulse waveforms in a synchronization process.

With the independent phase detectors, the synchronization process now operates differently than it would for the circuit of FIG. 1. FIG. 3 shows a flowchart of that process and FIG. 4 shows a representational timing diagram. At 40, the DAC phase calibration value is set to the DAC IQ modulator. As will be discussed further, there is a DAC phase calibration value set during calibration.

Similarly, the process sets the SYSREF phase calibration value to the SYSREF IQ modulator at 42. Referring to FIG. 4, one can see that DAC clock, the SYSREF clock and two of the DAC divided clocks DIV1 and DIV2. The DACs may not have the same phase relationships between each other, but they will have a leading clock edge that synchronizes with the SYSREF clock. The channel-to-channel skew between the DAC clocks will typically end up within 4 DAC clock cycles from each other because the internal divider in the DAC will start up in a random phase.

The DAC clocks are now shifted to have the same relationship. One may think of this as all the DAC clocks having the same starting point. Previously, for example, all the DAC clocks may have had a leading edge at a particular point in time, but for some of the DACs, it could have been t=2, and for another DAC, it may have been t=0. Shifting the DAC clocks to have the same phase relationship with the SYSREF clock puts them all at the same point in time. This causes the all the DACs to be synchronized. This is shown in the lower diagram of FIG. 4.

At 44, the phase relationship between the DAC clocks and the SYSREF clock is corrected by adjusting the DAC divider phase by rotating the DAC clocks. As mentioned above, the phase detectors in each channel monitor the relationships between the two clocks to ensure that the desired set up and hold windows are maintained. The above synchronization allows the digital signal generators, in this embodiment the FPGAs, to be issued a simultaneous start command at 46 with assurances that the data will be synchronized.

The individual phase detectors require calibration. The calibration process finds the voltage windows for the phase detectors that relates to the correct relationship between the clocks. In one embodiment, the SYSREF clock is the DAC clock divided by 32, resulting in 32 potential voltage windows considered valid regions. The valid regions are then stored in memory for reference during the synchronization process of FIG. 5.

Figure 5:
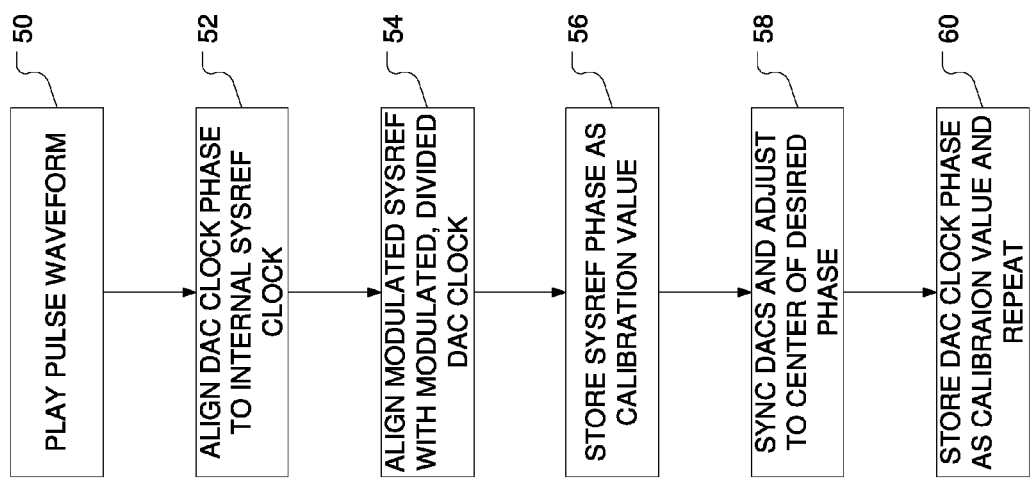
FIG. 5 shows a flowchart of one embodiment of a method to calibrate a phase detector.

FIG. 5 shows a flow chart of one embodiment of a method to calibrate the phase detectors. This process typically occurs at the factory prior to shipment of the apparatus that uses the synchronized DACs. At 50 a pulse waveform is played and a piece of test equipment such as an oscilloscope is used to test the DAC output. In one embodiment, where the SYSREF clock is divided by 32, a pulse waveform with a width of 1 DAC clock cycle and a total length greater than 64 samples was played.

At 52, the DAC clock phase is aligned to the phase of the internal SYSREF clock in the clock module. The modulated SYSREF clock out of the SYSREF IQ MOD is then aligned with a modulated, divided DAC clock out of the DAC CLOCK IQ MOD at 54. The SYSREF phase to which it has been aligned is then stored as the calibration value at 56. At 58 the DACs are synced and adjusted to be at the center of the desired phase. The DAC clock phase value after this adjustment is then stored as the calibration value for the DAC clocks and repeated as necessary.

In this manner, a more flexible architecture for DACs synchronization can be achieved. Having independent, more modular, DAC channels with their own phase detectors allows for additional channels to be added without having to redesign the phase detector. Eliminating the routing of signals to a central phase detector from each DAC also simplifies the routing, reducing the complexity of the circuit.

Although specific embodiments of the invention have been described for purposes if illustration, it will be understood that various modifications may be made without departing from the spirit and scope of the invention.

What is claimed is:

1. A device, comprising:
   a clock module configured to generate a common digital-to-analog converter clock and a system reference clock;
   at least two digital-to-analog converters, each digital-to-analog converter coupled with the clock module and configured to:
   set a phase for the common digital-to-analog converter clock to a phase calibration value;
   set the system reference clock to a system reference calibration value; and
   adjust a phase relationship between the common digital-to-analog converter clock and the system reference clock by rotating the digital-to-analog clocks.

2. The device of claim 1, wherein the clock module divides the digital-to-analog converter clock to generate the system reference clock.

3. The device of claim 1, each digital-to-analog converter connected to a device that generates digital signals.

4. The method of claim 1, further comprising generating the system reference clock by dividing a central digital-to-analog clock by 32.

5. The method of claim 1, further comprising monitoring a relationship between the system reference clock and the digital-to-analog converter clock with regard to setup and hold window requirements.

6. A method of synchronizing a plurality of digital-to-analog converters in a device, the method comprising, at each digital-to-analog converter:
   setting a phase for a digital-to-analog converter clock to a phase calibration value;
   setting a system reference clock to a system reference calibration value; and
   adjusting a phase relationship between the digital-to-analog converter clock and the system reference clock by rotating the digital-to-analog converter clock.

7. The method of claim 6, further comprising issuing a start command to one or more devices connected to the plurality of digital-to-analog converters at a same time.

8. A method of calibrating a phase detector, comprising:
   providing a pulse waveform;
   aligning a phase of a digital-to-analog clock to a phase of an internal system reference clock;
   aligning a phase of a modulated system reference clock with a phase of a modulated, divided, digital-to-analog clock;
   storing the aligned phase of the modulated system reference clock as a calibration value;
   synchronizing the digital-to-analog converters and adjusting the phase of the digital-to-analog converters to a center of a desired phase; and storing the aligned phase of the digital-to-analog converters as a calibration value.

9. The method of claim 8, wherein the calibrating of the phase detector is repeated as needed.

\* \* \* \* \*